United States Patent
Xiao

(10) Patent No.: US 10,205,130 B2
(45) Date of Patent: Feb. 12, 2019

(54) LASER SINTERING DEVICE AND LASER SINTERING METHOD

(71) Applicants: BOE TECHNOLOGY GROUP CO., LTD., Beijing (CN); ORDOS YUANSHENG OPTOELECTRONICS CO., LTD., Ordos (CN)

(72) Inventor: Ang Xiao, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 427 days.

(21) Appl. No.: 14/888,341

(22) PCT Filed: May 12, 2015

(86) PCT No.: PCT/CN2015/078754
§ 371 (c)(1),
(2) Date: Oct. 30, 2015

(87) PCT Pub. No.: WO2016/095415
PCT Pub. Date: Jun. 23, 2016

(65) Prior Publication Data
US 2016/0329529 A1    Nov. 10, 2016

(30) Foreign Application Priority Data

Dec. 15, 2014 (CN) .......................... 2014 1 0777719

(51) Int. Cl.
*H01L 51/56* (2006.01)
*H01L 51/52* (2006.01)
*B23K 26/324* (2014.01)

(52) U.S. Cl.
CPC ............ *H01L 51/56* (2013.01); *H01L 51/524* (2013.01)

(58) Field of Classification Search
CPC .......... H01L 51/56; H01L 51/51; H01L 51/52
(Continued)

(56) References Cited

U.S. PATENT DOCUMENTS 8,070,546 B2   12/2011  Joo et al.
8,500,506 B2    8/2013  Park et al.
(Continued)

FOREIGN PATENT DOCUMENTS

CN       101009232 A      8/2007
CN       101009275 A      8/2007
(Continued)

OTHER PUBLICATIONS

Written Opinion of the International Searching Authority and International Search Report regarding International Application No. PCT/CN2015/078754, dated Aug. 25, 2015. Translation provided by Dragon Intellectual Property Law Firm.
(Continued)

*Primary Examiner* — Samuel M Heinrich
(74) *Attorney, Agent, or Firm* — Harness, Dickey & Pierce, P.L.C.

(57) ABSTRACT

The laser sintering device includes a laser sintering head configured to output a laser beam toward a material to be sintered on a device to be sintered, so as to sinter the material to be sintered, and a heating unit configured to, prior to and/or subsequent to sintering the material with the laser sintering head, heating the material to be sintered and/or the sintered material. The material to be sintered is preheated by the heating unit prior to sintering the material to be sintered, and/or the sintered material is annealed by the heating unit subsequent to sintering the material to be sintered, so as to
(Continued)

reduce a difference between a temperature before the sintering and a temperature during the sintering, and/or reduce a cooling rate after the sintering, thereby to reduce a shrinkage stress applied to the material to be sintered and the device to be sintered.

20 Claims, 2 Drawing Sheets

(58) Field of Classification Search
USPC ............ 219/121.65, 121.66, 121.84, 121.86, 219/121.76
See application file for complete search history.

(56) References Cited

U.S. PATENT DOCUMENTS

| | | | |
|---|---|---|---|
| 8,864,543 B2 | 10/2014 | Park et al. | |
| 2002/0090313 A1* | 7/2002 | Wang | B22F 3/004 419/10 |
| 2005/0217319 A1 | 10/2005 | Yoshizawa | |
| 2005/0288813 A1* | 12/2005 | Yang | B22F 3/1055 700/119 |
| 2007/0084047 A1* | 4/2007 | Lange | B23P 6/005 29/889.1 |
| 2007/0170856 A1 | 7/2007 | Cha | |
| 2007/0176550 A1 | 8/2007 | Kwan | |
| 2007/0232182 A1* | 10/2007 | Park | H01L 51/5246 445/25 |
| 2009/0133807 A1 | 5/2009 | Amsden et al. | |
| 2010/0044547 A1* | 2/2010 | Higashi | B22F 3/003 249/79 |
| 2010/0267307 A1 | 10/2010 | Park et al. | |
| 2010/0279577 A1 | 11/2010 | Joo et al. | |
| 2013/0052766 A1 | 2/2013 | Goda | |
| 2014/0011418 A1 | 1/2014 | Park et al. | |

FOREIGN PATENT DOCUMENTS

| | | |
|---|---|---|
| CN | 101867022 A | 10/2010 |
| CN | 101877387 A | 11/2010 |
| CN | 101884246 A | 11/2010 |
| CN | 102823324 A | 12/2012 |
| CN | 102881844 A | 1/2013 |
| CN | 103178214 A | 6/2013 |
| CN | 203521482 U | 4/2014 |
| CN | 104157795 A | 11/2014 |
| CN | 104466034 A | 3/2015 |
| CN | 204216095 U | 3/2015 |

OTHER PUBLICATIONS

Office Action regarding Chinese Patent Application No. 201410777719.6, dated May 10, 2016. Translation provided by Dragon Intellectual Property Law Firm.

Third Office Action regarding Chinese Application No. 201410777719.6, dated Jul. 11, 2017. Translation provided by Dragon Intellectual Property Law Firm.

* cited by examiner

LASER SINTERING DEVICE AND LASER SINTERING METHOD

CROSS-REFERENCE TO RELATED APPLICATIONS

The present application is the U.S. national phase of PCT Application No. PCT/CN2015/078754 filed on May 12, 2015, which claims a priority of the Chinese patent application No. 201410777719.6 filed on Dec. 15, 2014. The disclosures of both of which are incorporated herein by reference in their entirety.

TECHNICAL FIELD

The present disclosure relates to the manufacture of a display device, in particular to a laser sintering device and a laser sintering method.

BACKGROUND

For an organic light-emitting diode (OLED) display device, a light-emitting material is driven by a current to emit light. The light-emitting material is very sensitive to temperature, air and water, so excellent packaging is of greatest importance for a service life and the image quality of the OLED display device. There are various packaging techniques for the OLED display device, e.g., laser packaging, thin film packaging, and injection packaging. Among them, the laser packaging technique is currently the most mature one, and its primary operating principle includes melting glass cement located at a specific position between two glass substrates (i.e., a cover glass substrate and a back glass substrate on which the light-emitting material and a circuit pattern are located) using a laser beam in an accurate and rapid manner, so as to package the two glass substrates.

However, for a traditional laser sintering method, a temperature of the glass cement will increase from a room temperature to 800-1000□ instantaneously, and then decrease to the room temperature. During the rapid heating and cooling procedures, a shrinkage stress may be accumulated inside the glass cement, so cracks or even splits may easily occur for the glass cement and the glass substrates packaged by the glass cement. Currently, there are substantially two methods for overcoming this defect. One is to reduce thermal expansion coefficients of the glass substrates and the glass cement, so as to reduce the shrinkage stress, and the other is to reduce a laser sintering speed. However, when the first method is adopted, there are great limitation to the materials of the glass substrates and the glass cement, and the second method is inapplicable to mass production. Hence, the manufacture of the OLED display device will be greatly limited when the two methods are adopted.

SUMMARY

An object of the present disclosure is to provide a laser sintering device and a laser sintering method, so as to prevent the occurrence of cracks or splits for a material to be sintered due to great shrinkage generated when the material is sintered using a laser beam.

In one aspect, the present disclosure provides in one embodiment a laser sintering device, including a laser sintering head configured to output a laser beam toward a material to be sintered on a device to be sintered, so as to sinter the material to be sintered, and a heating unit configured to, prior to and/or subsequent to sintering the material with the laser sintering head, heating the material to be sintered and/or the sintered material.

Alternatively, the heating unit is configured to, prior to sintering with the laser sintering head, heat the material to be sintered to 400-500□.

Alternatively, the laser sintering device further includes a support substrate configured to support at one surface the device to be sintered, and the heating unit is arranged at the other surface of the support substrate.

Alternatively, the surface of the support substrate where the device to be sintered is supported is provided with a ventilation duct, and the ventilation duct is arranged at a position corresponding to a region where the material to be sintered is located and configured to, after the sintering with the laser sintering head has been completed, supply a gas at a predetermined temperature to the region so as to cool the region.

Alternatively, the heating unit includes an infrared generator configured to generate an infrared ray at a wavelength of 795 nm to 810 nm.

Alternatively, a mask plate is provided at a side of the heating unit facing the material to be sintered, and a via-hole in the mask plate corresponds to the material to be sintered on the device to be sintered.

Alternatively, a mask plate is arranged between the heating unit and the support substrate, and a via-hole in the mask plate corresponds to the material to be sintered on the device to be sintered.

Alternatively, the support substrate is a transparent substrate.

Alternatively, the device to be sintered includes a first side surface and a second side surface opposite to each other, the material to be sintered is arranged between the first side surface and the second side surface, the laser sintering head is arranged opposite to the first side surface and configured to output the laser beam toward the first side surface, and the heating unit is arranged opposite to the second side surface and configured to heat the second side surface.

Alternatively, the laser sintering head and the heating unit are arranged at an identical side of the device to be sintered.

In another aspect, the present disclosure further provides in one embodiment a laser sintering method, including steps of: outputting a laser beam toward a material to be sintered on a device to be sintered so as to sinter the material to be sintered, and prior to and/or subsequent to sintering, heating the material to be sintered and/or the sintered material.

Alternatively, in the step of, prior to sintering, heating the material to be sintered, the material to be sintered is heated to 400-500□.

Alternatively, in the step of, prior to and/or subsequent to sintering, heating the material to be sintered and/or the sintered material, the material to be sintered and/or the sintered material are heated by an infrared ray at a wavelength of 795 nm to 810 nm from an infrared generator.

Alternatively, the laser sintering method further includes, subsequent to sintering, cooling the sintered material with a gas at a predetermined temperature.

Alternatively, in the step of cooling the sintered material with the gas at a predetermined temperature, the sintered material is cooled at a rate of 10□ per minute.

Alternatively, in the steps of sintering and heating the material to be sintered, the material to be sintered on the device to be sintered is sintered and heated at both sides.

DETAILED DESCRIPTION

In order to make the objects, the technical solutions and the advantages of the present disclosure more apparent, the present disclosure will be described hereinafter in conjunction with the drawings and embodiments.

The present disclosure provides in one embodiment a laser sintering device, which includes a laser sintering head configured to output a laser beam toward a material to be sintered on a device to be sintered, so as to sinter the material to be sintered, and a heating unit configured to, prior to and/or subsequent to sintering the material with the laser sintering head, heating the material to be sintered and/or the sintered material.

According to the laser sintering device in the embodiment of the present disclosure, the material to be sintered is preheated by the heating unit prior to sintering the material to be sintered, and/or the sintered material is annealed by the heating unit subsequent to sintering the material to be sintered, so as to reduce a difference between a temperature before the sintering and a temperature during the sintering, and/or reduce a cooling rate after the sintering, thereby to reduce a shrinkage stress applied to the material to be sintered and the device to be sintered, and prevent the occurrence of cracks and even splits for the device to be sintered due to the shrinkage stress.

Alternatively, the device to be sintered includes a first side surface and a second side surface opposite to each other, the material to be sintered is arranged between the first side surface and the second side surface, the laser sintering head is arranged opposite to the first side surface and configured to output the laser beam toward the first side surface, and the heating unit is arranged opposite to the second side surface and configured to heat the second side surface. In other words, the laser sintering head and the heating unit are configured to sinter and heat the material to be sintered at different sides of the device to be sintered, respectively.

Of course, the arrangement mode of the laser sintering head and the heating unit is not limited to the above, and they may also be arranged at an identical side of the device to be sintered.

The above laser sintering device may be used to package a display device. To be specific, glass cement coated onto the display device to be packaged is heated by the laser beam and then melted, so as to adhere two parts of the display device to each other. When the laser sintering device is used to package the display device, the device to be sintered is just the display device to be packaged, and the material to be sintered is just the glass cement.

The laser sintering device will be described hereinafter when it is used to package a display device.

Figure 1:
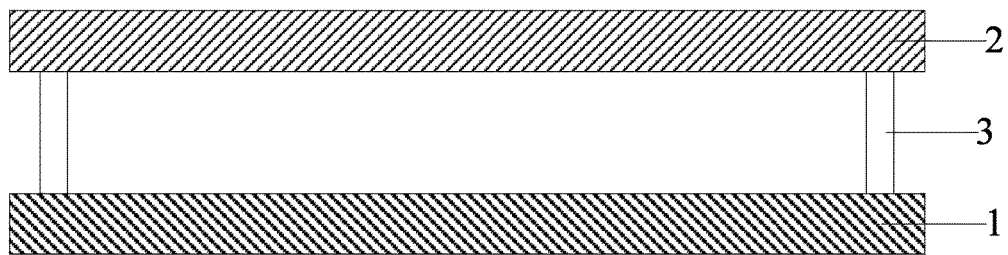
FIG. 1 is a schematic view showing an existing display device.

Referring to FIG. 1, which is a schematic view showing an existing display device, the display device includes a back glass substrate 1 and a cover glass substrate 2 arranged opposite to, and parallel to, each other, and an element for displaying an image is arranged between the back glass substrate 1 and the cover glass substrate 2. For an OLED display device, various light-emitting functional layers are arranged between the back glass substrate 1 and the cover glass substrate 2. During the packaging, the glass cement 3 is applied onto a bezel portion of the back glass substrate 1, and the cover glass substrate 2 is arranged above the light-emitting functional layers. Then, the glass cement is sintered by a laser beam from an upper surface of the cover glass substrate 2, so as to adhere the back glass substrate 1 to the cover glass substrate 2.

Based upon the above, it should be appreciated that, the first side surface and the second side surface of the display to be packaged are just outer surfaces of the back glass substrate 1 and the cover glass substrate 2. To be specific, the laser sintering head and the heating unit may be arranged on different sides of the outer surfaces of the back glass substrate 1 and the cover glass substrate 2, respectively, or on same side of the outer surfaces of the back glass substrate 1 and the cover glass substrate.

Figure 2:
FIG. 2 is a schematic view showing a laser sintering device according to the first embodiment of the present disclosure.

FIG. 2 is a schematic view showing the laser sintering device according to the first embodiment of the present disclosure. In this embodiment, the laser sintering head 10 and the heating unit 20 are arranged above the cover glass substrate 2, and the glass cement 3 is heated by the heating unit 20 from an outer surface of the cover glass substrate 2. After the glass cement 3 is heated to a predetermined temperature, a laser beam is outputted by the laser sintering head 10 toward the glass cement 3 so as to sinter the glass cement 3, thereby to adhere the cover glass substrate 2 to the back glass substrate 1.

As mentioned above, through preheating the glass cement, it is able to reduce a difference between a temperature before the sintering and a temperature during the sintering, thereby to reduce a shrinkage stress applied to the glass cement and the glass substrates, and prevent the occurrence of cracks and even splits for the glass substrates due to the shrinkage stress.

Of course, after the glass cement 3 has been sintered by the laser sintering head 10, the heating unit 20 may continually heat the glass cement 3 from the outer surface of the cover glass substrate 2, so as to subject the glass cement 3 to annealing treatment and cool the glass cement 3 slowly, thereby to further reduce the shrinkage stress applied to the glass cement and the glass substrates, and prevent the occurrence of cracks and even splits for the glass substrates due to the shrinkage stress.

To be specific, the heating unit 20 may be an infrared generator for heating the glass cement with an infrared ray, or a laser beam generator, like the laser sintering head 10, for heating the glass cement with a laser beam.

Alternatively, prior to sintering the material with the laser sintering head 10, the glass cement 3 is preheated by the heating unit 20 to 400-500□, and after the sintering has been completed, the glass cement 3 is also annealed at a temperature of 400-500□. In addition, the glass cement 3 is sintered by the laser sintering head 10 at a temperature of 800 to 1000□.

In the first embodiment, the glass cement is heated by the laser sintering head 10 and the heating unit 20 at an identical side of the display device. It should be appreciated that, the laser sintering heads 10 and the heating units 20 may also be arranged at either side of the display device, respectively, that is, on each side of the display device the laser sintering heads 10 and the heating units 20 are arranged, so as to heat and cure the glass cement 3.

Figure 3:
FIG. 3 is another schematic view showing the laser sintering device according to the second embodiment of the present disclosure.

For economic reasons, as shown in FIG. 3, the present disclosure further provides in the second embodiment the laser sintering device, where the laser sintering head 10 and the heating unit 20 are arranged at both sides of the display device, respectively, as compared with that mentioned in the first embodiment. The laser sintering head 10 is arranged at an upper side of the display device and configured to output a laser beam toward the glass cement 3 through the outer surface of the cover glass substrate 2 (the first side surface), so as to sinter the glass cement 3. The heating unit 20 is arranged at a lower side of the display device, and configured to heat the glass cement 3 from the outer surface of the back glass substrate 1 (the second side surface). To be specific, prior to the sintering, the glass cement 3 may be preheated by the heating unit 20, and after the sintering, the glass cement 3 may be heated by the heating unit 20 from the outer surface of the back glass substrate 1 so as to subject the glass cement 3 to annealing treatment, thereby to reduce the shrinkage stress applied to the glass cement and the glass substrates, and prevent the occurrence of cracks and even splits due to the shrinkage stress.

The heating mode of the heating unit 20 and the temperature at which the glass cement 3 is to be heated are identical to those mentioned in the first embodiment, and thus will not be repeated herein.

Figure 4:
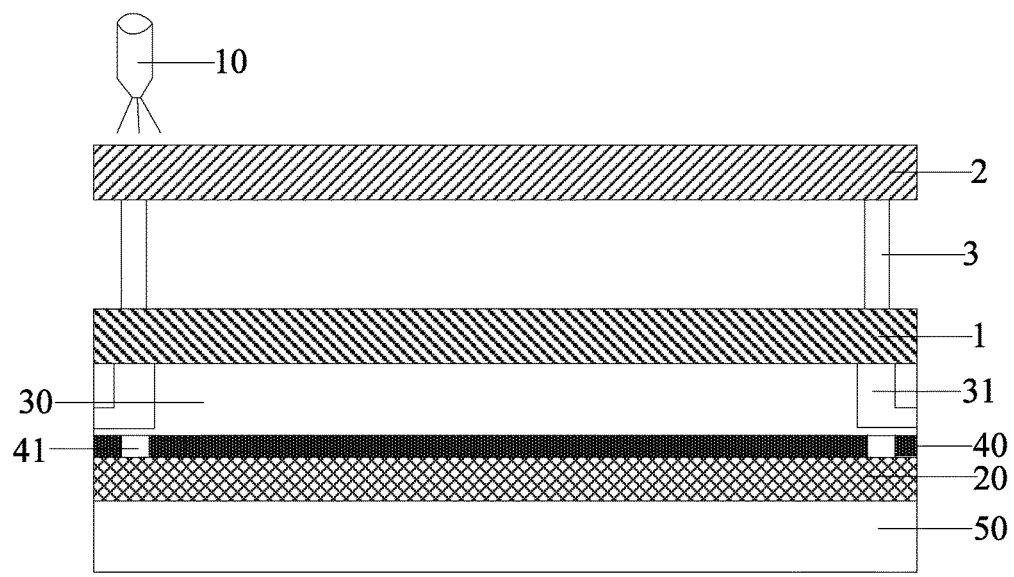
FIG. 4 is yet another schematic view showing the laser sintering device according to the third embodiment of the present disclosure.

In addition, referring to FIG. 4 which is a schematic view showing the laser sintering device according to the third embodiment of the present disclosure, the laser sintering head 10 and the heating unit 20 are arranged at both sides of the display device, respectively. The laser sintering device further includes a support substrate 30 for supporting the display device to be packaged. The laser sintering head 10 is arranged at a side of the cover glass substrate 2 away from the back glass substrate 1, and configured to output a laser beam toward the outer surface of the cover glass substrate 2 so as to heat the glass cement 3. The heating unit 20 is arranged at a surface of the support substrate 30 other than a surface where the display device is arranged, supported by a platform 50, and configured to heat the glass cement 3 on the back glass substrate 1 through the support substrate 30.

Alternatively, the support substrate 30 is transparent. The heating unit 20 includes an infrared generator, and it is configured to generate an infrared ray at a wavelength of 795 nm to 810 nm, so as to heat the glass cement 3 from the back glass substrate 1. Alternatively, the support substrate 30 and the back glass substrate 1 are made of a material incapable of absorbing the infrared ray within the wavelength range. Hence, the infrared ray is not absorbed by the support substrate 30 and the back glass substrate 1, and it is fully used to heat the glass cement 3.

Further, in order to enable the ray from the heating unit 20 to be merely transmitted to the glass cement 3 on the back glass substrate 1, referring to FIG. 4, the laser sintering device further includes a mask plate 40 arranged between the heating unit 20 and the support substrate 30. The mask plate 40 is provided with a via-hole 41 arranged at a position corresponding to the glass cement on the back glass substrate 1. Alternatively, a via-hole in communication with the via-hole 41 in the mask plate 30 is also provided in the support substrate 30 at a position corresponding to the glass cement on the back glass substrate 1. It should be appreciated that, the mask plate 40 may also be arranged at a side of the heating unit 20 facing the glass cement 3, so as to shield rays from the heating unit 20 and prevent the other parts of the display device from being affected by the heating unit.

Alternatively, a surface of the support substrate 30 where the display device is to be placed (i.e., the surface adhered to the back glass substrate 1) is provided with a ventilation duct 31, and the ventilation duct 31 is arranged at a position corresponding to a region where the glass cement is located and configured to, after the sintering with the laser sintering head 10 has been completed, supply a gas at a predetermined temperature to the region so as to cool the region. To be specific, the gas may be $N_2$ or clean air. Alternatively, the gas at the predetermined temperature is inputted to the region at the surface of the back glass substrate 1 where the glass cement is located, so as to cool the glass cement 3 at a rate of 10□ per minute. As compared with the situation where the glass cement is cooled naturally after the sintering, it is able to cool the glass cement slowly, thereby to reduce the shrinkage stress applied to the glass cement and the glass substrates, and prevent the occurrence of cracks and even splits due to the shrinkage stress.

According to the laser sintering device in the third embodiment, prior to sintering with the laser sintering head 10, the glass cement 3 is preheated with an infrared ray from the heating unit 20. Alternatively, after the temperature reaches 400-500□, the heating unit 20 stops outputting the infrared ray, i.e., it stops heating. At this time, the laser sintering head 10 outputs a laser beam so as to scan the glass cement from the upper surface of the cover glass substrate 2. When the temperature of the glass cement 3 increases to 800-1000□, the sintering is stopped. Then, $N_2$ or clear air at a predetermined temperature is supplied through the ventilation duct 31 under the back glass substrate 2, so as to cool the glass cement 3 at a rate of 10□ per minute. Through preheating the glass cement before the sintering and annealing the glass cement after the sintering, it is able to reduce a difference between the temperature before the sintering and the temperature after the sintering, and reduce a cooling rate after the sintering, thereby to reduce the shrinkage stress applied to the glass cement and the glass substrates and prevent the occurrence of cracks and even splits due to the shrinkage stress.

The present disclosure further provides in one embodiment a laser sintering method, which includes steps of outputting the laser beam toward the material to be sintered on the device to be sintered so as to sinter the material to be sintered, and prior to and/or subsequent to sintering, heating the material to be sintered and/or the sintered material.

Alternatively, in the step of, prior to sintering, heating the material to be sintered, the material to be sintered is heated to 400-500□.

Alternatively, in the step of, prior to and/or subsequent to sintering, heating the material to be sintered and/or the sintered material, the material to be sintered and/or the sintered material are heated by an infrared ray at a wavelength of 795 nm to 810 nm from an infrared generator.

Further, the laser sintering method includes, subsequent to sintering, cooling the sintered material with a gas at a predetermined temperature. Alternatively, in the step of cooling the sintered material with the gas at a predetermined temperature, the sintered material is cooled at a rate of 10□ per minute.

In addition, the sintering step and the step of heating the material to be sintered and/or the sintered material prior to and/or subsequent to the sintering may be performed at an identical side, or at different sides, of the device to be sintered.

Alternatively, in the sintering step and the step of heating the material to be sintered, the material to be sintered may be sintered and heated at both sides of the device to be sintered, so as to reduce an internal temperature difference of the material to be sintered.

When the above-mentioned laser sintering method is used to package a display device, the device to be sintered is the display device to be packaged, and the material to be sintered is glass cement.

However, the above-mentioned laser sintering device and laser sintering method are not limited to be use to package the display device, and instead, they may be applied to any laser sintering process, so as to prevent the occurrence of cracks and even splits for the material to be sintered due to the large shrinkage stress generated during the sintering.

According to the laser sintering device and the laser sintering method in the embodiments of the present disclosure, it is able to reduce a difference between the temperature before the sintering and the temperature after the sintering, and/or reduce a cooling rate of the glass cement, thereby to reduce the shrinkage stress applied to the glass cement and the glass substrates, and prevent the occurrence of cracks and even splits due to the shrinkage stress.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A laser sintering device for packaging a display device, comprising:
   a laser sintering head configured to output a laser beam toward a material to be sintered on a device to be sintered, so as to sinter the material to be sintered; and
   a heating unit configured to, prior to and subsequent to sintering the material with the laser sintering head, heating the material to be sintered and the sintered material,
   wherein the material to be sintered includes a glass cement that adheres two parts of the display device to each other.

2. The laser sintering device according to claim 1, wherein the heating unit is configured to, prior to sintering with the laser sintering head, heat the material to be sintered to 400-500° C.

3. The laser sintering device according to claim 1, further comprising:
   a support substrate configured to support at one surface the device to be sintered,
   wherein the heating unit is arranged at the other surface of the support substrate.

4. The laser sintering device according to claim 3, wherein the surface of the support substrate where the device to be sintered is supported is provided with a ventilation duct, and the ventilation duct is arranged at a position corresponding to a region where the material to be sintered is located and configured to, after the sintering with the laser sintering head has been completed, supply a gas at a predetermined temperature to the region so as to cool the region.

5. The laser sintering device according to claim 1, wherein the heating unit comprises an infrared generator configured to generate an infrared ray at a wavelength of 795 nm to 810 nm.

6. The laser sintering device according to claim 1, wherein a mask plate is provided at a side of the heating unit facing the material to be sintered, and a via-hole in the mask plate corresponds to the material to be sintered on the device to be sintered.

7. The laser sintering device according to claim 3, wherein a mask plate is arranged between the heating unit and the support substrate, and a via-hole in the mask plate corresponds to the material to be sintered on the device to be sintered.

8. The laser sintering device according to claim 3, wherein the support substrate is a transparent substrate.

9. The laser sintering device according to claim 1, wherein the device to be sintered comprises a first side surface and a second side surface opposite to each other, the material to be sintered is arranged between the first side surface and the second side surface, the laser sintering head is arranged opposite to the first side surface and configured to output the laser beam toward the first side surface, and the heating unit is arranged opposite to the second side surface and configured to heat the second side surface.

10. The laser sintering device according to claim 1, wherein the laser sintering head and the heating unit are arranged at an identical side of the device to be sintered.

11. A laser sintering method for packaging a display device, comprising steps of:
    outputting a laser beam toward a material to be sintered on a device to be sintered so as to sinter the material to be sintered; and
    prior to and subsequent to sintering, heating the material to be sintered and the sintered material,
    wherein the material to be sintered includes a glass cement and adheres two parts of the display device to each other.

12. The laser sintering method according to claim 11, wherein in the step of, prior to sintering, heating the material to be sintered, the material to be sintered is heated to 400-500° C.

13. The laser sintering method according to claim 11, wherein in the step of, prior to and/or subsequent to sintering, heating the material to be sintered and/or the sintered material, the material to be sintered and/or the sintered material are heated by an infrared ray at a wavelength of 795 nm to 810 nm from an infrared generator.

14. The laser sintering method according to claim 11, further comprising:
    subsequent to sintering, cooling the sintered material with a gas at a predetermined temperature.

15. The laser sintering method according to claim 14, wherein in the step of cooling the sintered material with the gas at a predetermined temperature, the sintered material is cooled at a rate of 10° C. per minute.

16. The laser sintering method according to claim 11, wherein in the steps of sintering and heating the material to be sintered, the material to be sintered on the device to be sintered is sintered and heated at both sides.

17. The laser sintering device according to claim 2, wherein the heating unit comprises an infrared generator configured to generate an infrared ray at a wavelength of 795 nm to 810 nm.

18. The laser sintering device according to claim 3, wherein the heating unit comprises an infrared generator configured to generate an infrared ray at a wavelength of 795 nm to 810 nm.

19. The laser sintering device according to claim 4, wherein the heating unit comprises an infrared generator configured to generate an infrared ray at a wavelength of 795 nm to 810 nm.

20. The laser sintering device according to claim 1, wherein the heating unit is configured to perform at least one of preheating the material to be sintered prior to sintering with the laser sintering head, or annealing the sintered material subsequent to sintering the material with the laser sintering head.

* * * * *